United States Patent [19]
Wang et al.

[11] Patent Number: 5,886,134
[45] Date of Patent: Mar. 23, 1999

[54] BISMALEIMIDE-TRIAZINE RESIN AND PRODUCTION METHOD THEREOF

[75] Inventors: Chun-Shan Wang; Haan-Jang Hwang, both of Tainan, Taiwan

[73] Assignee: National Science Council of Republic of China, Taipei, Taiwan

[21] Appl. No.: 944,184

[22] Filed: Oct. 6, 1997

[51] Int. Cl.$^6$ ............................ C08G 69/00; C08G 73/00
[52] U.S. Cl. .................. 528/310; 528/142; 528/146; 528/162; 528/322; 525/423; 525/426; 525/434; 525/436; 525/523; 525/534; 525/535; 525/537
[58] Field of Search .................................... 528/310, 322, 528/142, 146, 162; 525/423, 426, 436, 434, 535, 537, 523, 534

[56] References Cited

U.S. PATENT DOCUMENTS

| | | | |
|---|---|---|---|
| 4,287,014 | 9/1981 | Gaku et al. | 525/185 |
| 4,978,727 | 12/1990 | Das et al. | 528/162 |
| 5,189,116 | 2/1993 | Boyd et al. | 525/436 |
| 5,426,161 | 6/1995 | Das et al. | 528/162 |
| 5,548,034 | 8/1996 | Afzali-Ardakani et al. | 525/534 |

*Primary Examiner*—P. Hampton-Hightower
*Attorney, Agent, or Firm*—Bacon & Thomas, PLLC

[57] ABSTRACT

The invention relates to a Bismaleimide-Triazine resin (BT resin) and production method thereof and in particular, a series of novel BT resin prepared by reacting a novel bismaleimide with various aromatic cyanate esters. By combining said novel bismaleimide monomer with various proportions of cyanate esters having different structures, BT resins having various processing temperature conditions can be formulated, which, after polymerizing and crosslinking, can provide materials with various thermal stability, dielectric constants, and mechanical properties for various applications.

9 Claims, 5 Drawing Sheets

HO—R$_2$—OH + 2 BrCN $\xrightarrow{\text{Triethylamine}}$ NCO—R$_2$—OCN + 2HBr·N(C$_2$H$_5$)$_3$

BISMALEIMIDE-TRIAZINE RESIN AND PRODUCTION METHOD THEREOF

BACKGROUND OF THE INVENTION

1. Field of the Invention

The invention relates to a bismaleimide-triazine resin and a production method thereof and in particular, to a series of novel BT resins prepared by reacting a novel bismaleimide monomer with various aromatic cyanate esters.

2. Description of the prior art

There are not so many types of BT resins known in the art and those are made predominantly by combining diphenylmethane bismaleimide with bisphenol A cyanate resin in various mole ratios. The present invention consists of preparing a series of novel BT resins by using novel bismaleimides with various aromatic cyanate esters.

U.S. Pat. No. 4,110,364 (Mitsubishi, Japan, 1978), disclosed a BT resin synthesized from bismaleimide and cyanate ester. As shown in FIG. 1, cyanate ester itself can be cyclotrimerized in to a triazine structure (10), or it can be copolymerized with a maleimide to form a pyrimidine structure(11), where $R_1$ in FIG. 1 is as shown in FIG. 2, $R_2$ is as shown in FIG. 3, and where R in FIG. 2 and 3 may be H, lower alkyl group ($C_1$–$C_7$), cycloalkyl($C_4$–$C_7$), phenyl and the like, and m=0–4.

BT resin has excellent elevated temperature characteristics, solvent resistance, low water absorption, and low dielectric constant. Such resin compositions can be blended with other thermosetting resins and other reactive diluents such as o-diallyl phthalate, triallyl cyanurate or triallyl isocyanurate, to modify such BT resin.

Many BT resins known in the art are made predominantly from diphenylmethane bismaleimide and bisphenol A cyanate resin in various proportions. BT resins comprise solid, liquid and solution types, are applicable in a variety of processing uses such as laminating, preformed insulating sheet structural materials, coating, filling and the like, and can be used in multi-layer printed circuit boards and as encapsulants.

SUMMARY OF THE INVENTION

The object of the invention is to provide a novel BT resin having enhanced thermal stability, excellent chemical resistance, and lower moisture absorption than conventional BT resins as well as good processability and solubility without loss of thermal stability.

Another object of the invention is to provide a method for preparing said novel BT resin of the invention, comprising reacting a novel bismaleimide with aromatic cyanate esters.

Still another object of the invention is to provide a novel bismaleimide monomer useful for preparing the novel BT resin of the invention, which is 2,7-bis(4-maleimidophenoxy)-naphthalene.

BRIEF DESCRIPTION OF THE DRAWINGS

Other objects, advantages and features of the invention will be apparent form the following description in conjunction with accompanying drawings, in which:

FIG. 5 shows a flow sheet for synthesis of the cyanate ester monomers incorporated in the BT resins and their preparation method thereof according to the invention.

DETAILED DESCRIPTION OF PREFERRED EMBODIMENTS

Figure 4:
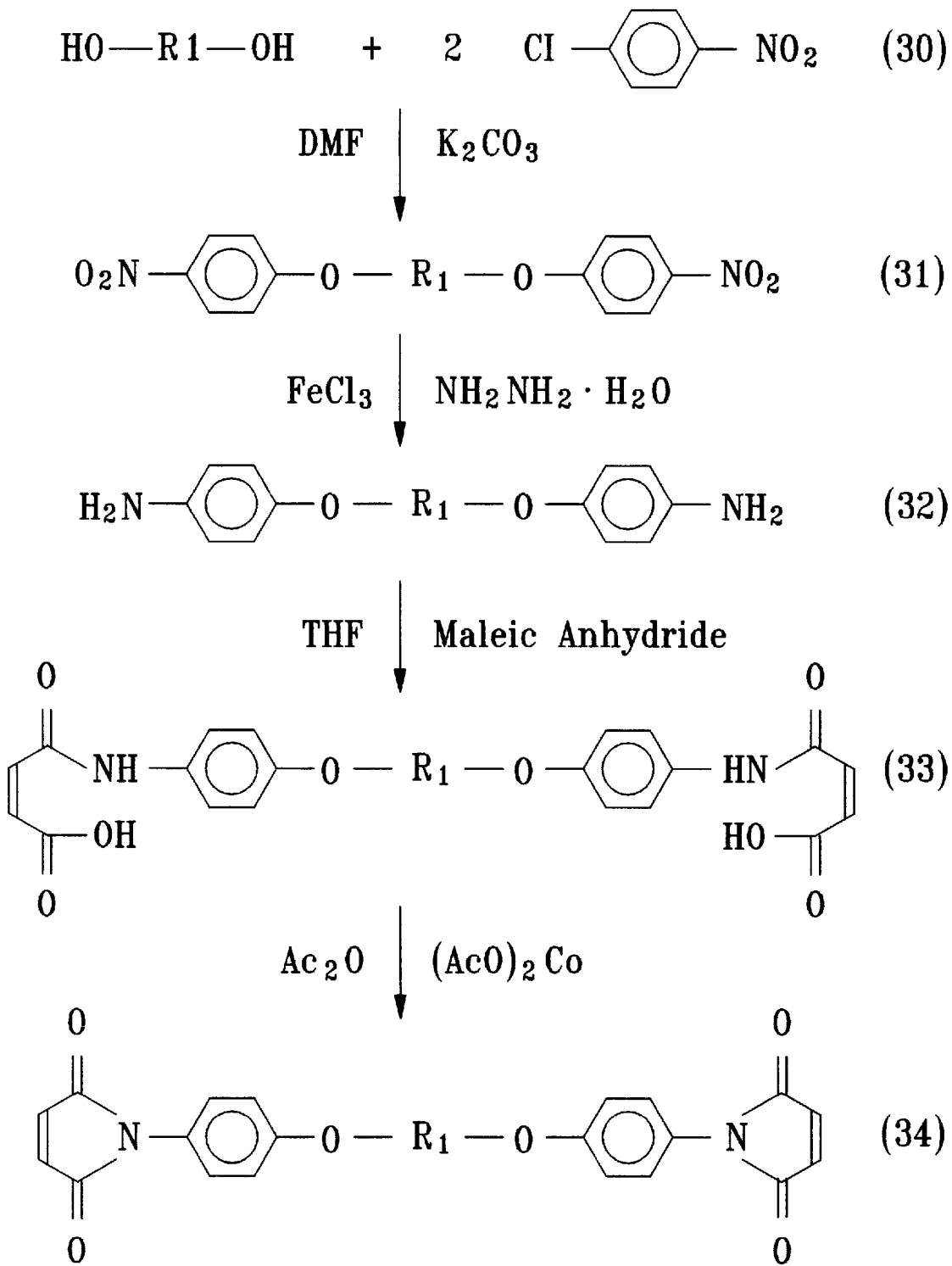
FIG. 4 shows a flow sheet for synthesis of the bismaleimide monomer incorporated in the BT resin and its preparation method thereof according to the invention.

The novel bismaleimide as one of the raw materials useful for preparing the BT resin of the invention can be synthesized, as shown in FIG. 4, by reacting dihydroxynaphthalene or -benzene with chloronitrobenzene(30) into a dinitrocompound(31) which is reduced by hydrogenation into a diaminocompound(32), and reacting said diaminocompound with maleic anhydride into a bismaleimide which can be dehydrated and cyclized to form the desired novel bismaleimide(34).

Figure 1:
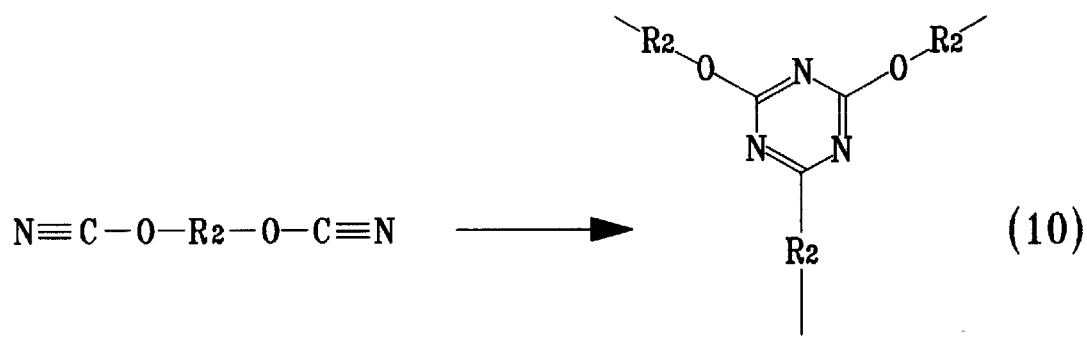
FIG. 1 shows the chemical formulae of conventional triazines and pyrimidines.
Figure 1:
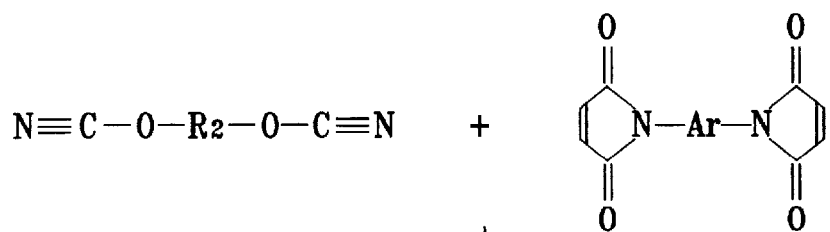
Figure 1:
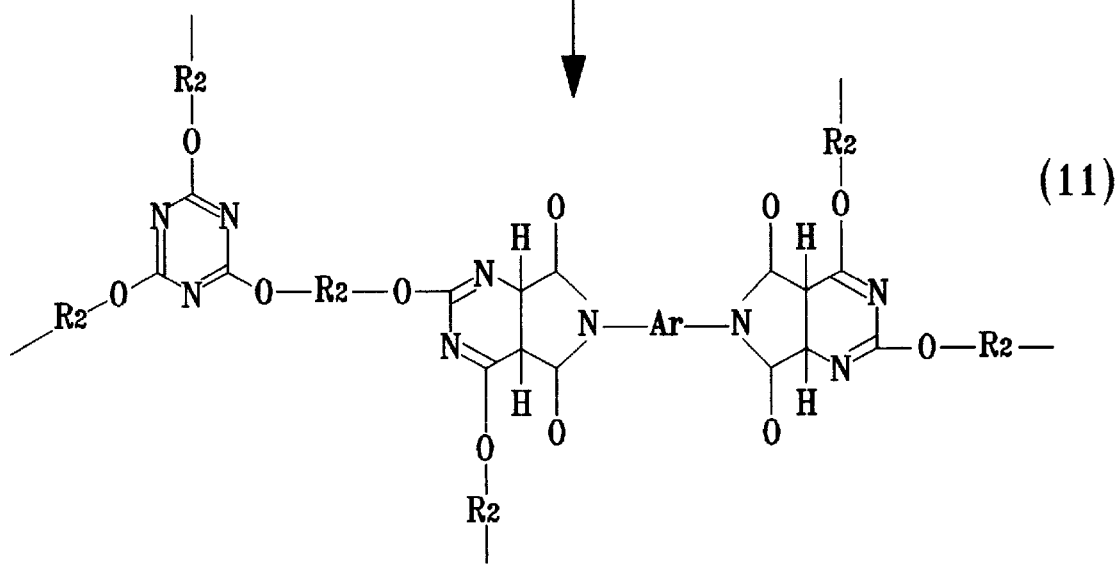
Figure 1:
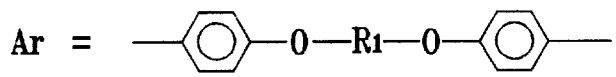
Figure 2:
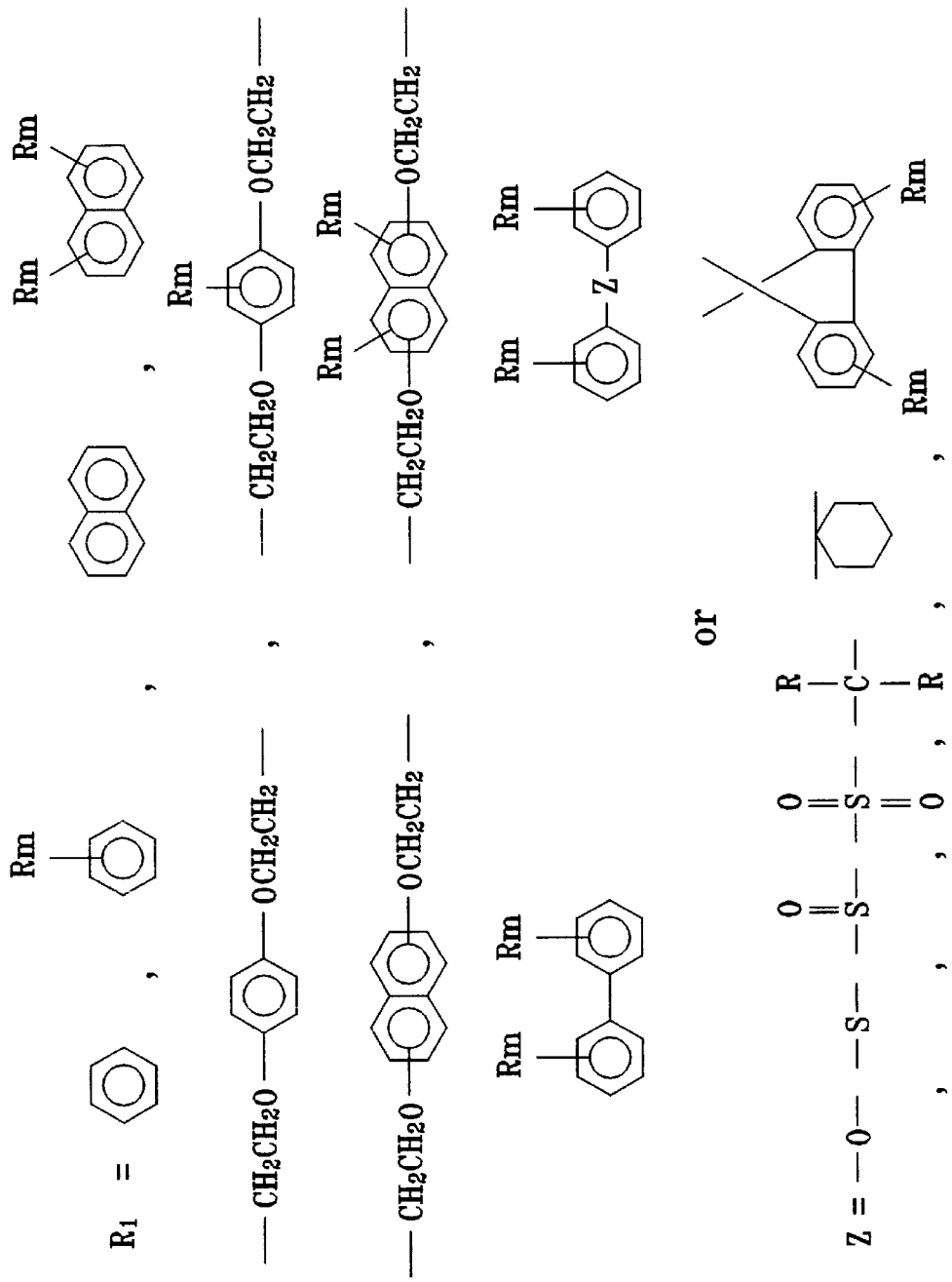
FIG. 2 shows chemical formulae of $R_1$ in each Figure.
Figure 3:
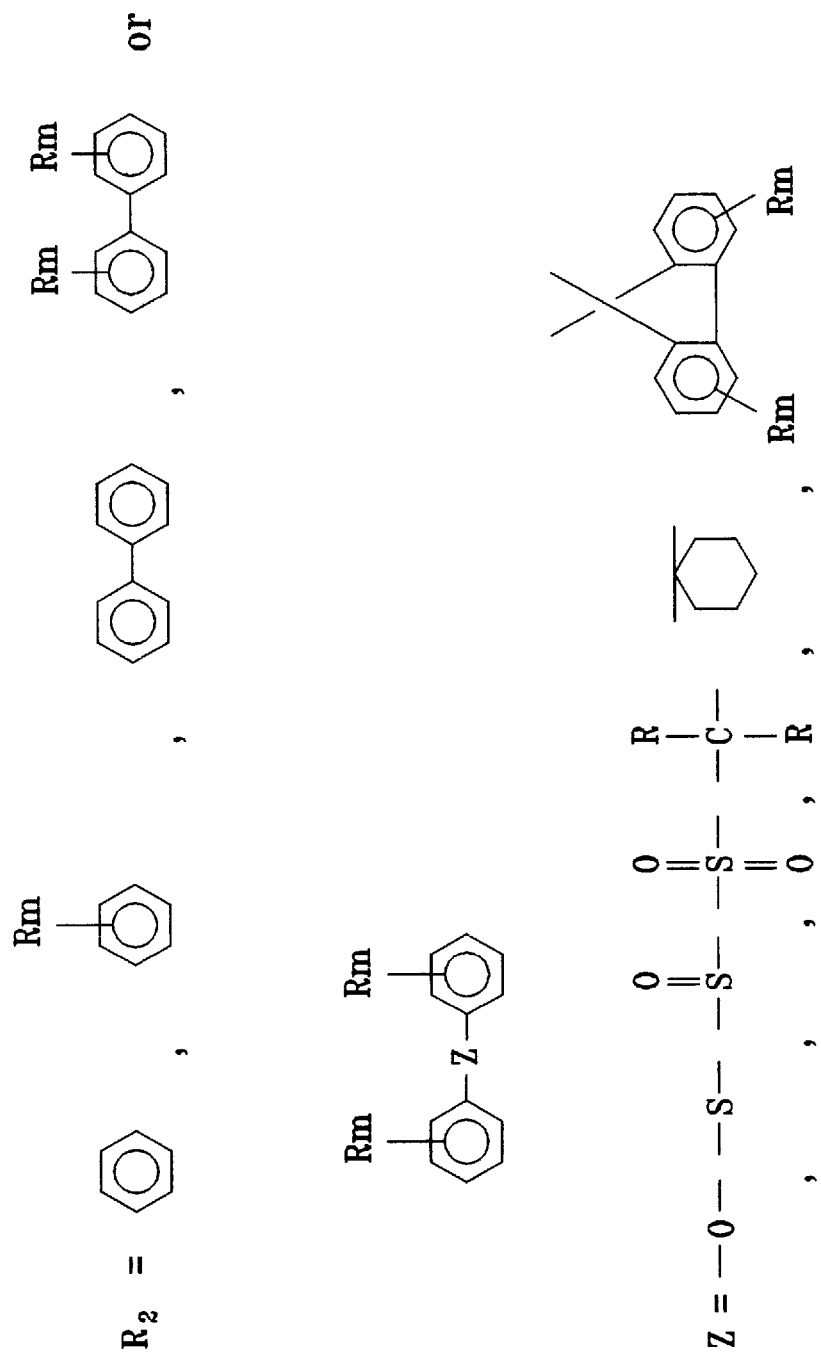
FIG. 3 shows chemical formulae of $R_2$ in each Figure.

Synthesis of the cyanate ester monomer as the other raw material can be accomplished, as shown in FIG. 5, by reacting a bisphenol with cyanogen bromide(40) to form an aromatic bisphenol dicyanate(41). Suitable aromatic bisphenols are hydroquinone, 4,4-biphenol,.bis(4-hydroxyphenyl) methane, 4,4'-dihydroxydiphenyl ether, 2,2-bis(4-hydroxyphenyl)propane, 4,4'-methylenebis(2,6-dimethylphenol), and the like. Structural formula of $R_1$ and $R_2$ in FIG. 2 and 3 are shown in FIG. 2 and 3, R in FIG. 2 and 3 may be H, lower alkyl ($C_1$–$C_7$), cycloalkyl($C_4$–$C_7$), phenyl and the like, and m=0–4.

The bismaleimide is mixed thoroughly with various aromatic bisphenol cyanate in mole ratios of 4/1, 2/1, 1/1, 1/2 or 1/4 and 500 ppm of Cu(acetylacetonate) as catalyst is added, and subsequently, cured at 180° C. for 2 hours, followed by at 250° C. for 4 hours, and thereby, yield a series of novel BT resins.

The present invention will be better understood from the description of the following illustrative but non-limiting Examples.

EXAMPLE 1

Synthesis of 2,7-bis(4-maleimidophenoxy) naphthalene monomer, cf flow sheet in FIG. 4.

(a) Synthesis of 2,7-Bis(4-nitrophenoxy)naphthalene(31)

In a reactor provided with a stirrer, a reflux condenser, a temperature controlling apparatus and a nitrogen inlet, charged with 250 ml of dimethylformamide (DMF) solvent, 80.05 g(0.5 mole) of 2,7-dihydroxynaphthalene, 173.35 g(1.1 mole) of p-chloronitrobenzene and 82.2 g (0.6 mole) of potassium carbonate. The reaction mixture was heated to reflux (140°–145° C.) under nitrogen atmosphere for 8 hours. At the end of reaction, the reaction mixture was hot filtered to remove inorganic salts and washed the inorganic salts with 90 ml of DMF. The filtrate and washes were combined and heated to 100°–110° C., and, then, 60 ml of water was added while hot, cooled slowly down to room temperature, where the product was gradually precipitated. The product was filtered, stirred with 500 ml of methanol, filtered again, and dried in vacuo to obtain the dinitro monomer(31) in a yield of 92%, mp 167°–168° C. Analysis for $C_{22}H_{14}N_2O_6$, calcd: C, 65.67%;H, 3.48%;N, 6.97%; Found: C, 65.66;H, 3.47%;N, 6.92%.

(b) Synthesis of 2,7-Bis(4-aminophenoxy)naphthalene (32)

A mixture of the dinitromonomer (0.1 mole) obtained above, active carbon (2 g) and ferric chloride ($FeCl_3.6H_2O$) in ethanol (200 g) was preheated to 85° C., added dropwise 50 ml of hydrazine monohydrate (85%) into the reactor and maintained at that temperature for 4 hours. The desired diamino product was then obtained (ca. 95% in yield). The resulting diamino monomer can be recrystalized in 2-methoxyethanol or DMF . mp 166°–167° C. Analysis for $C_{22}H_{18}N_2O_6$, calcd: C, 77.19%; H, 5.26%; N, 8.19%; Found: C, 76.97%; H, 5,26%; N, 8.18%.

(c) Synthesis of 2,7-Bis(4-maleamidophenoxy)naphthalene (33)

In a three-necked round bottom flask provided with a droping funnel, a stirrer and a nitrogen inlet, charged with maleic anhydride (0.22 mole )and tetrahydrofuran (100 ml) and, further, under a nitrogen atmosphere, the diamino monomer obtained in (b) was dissolved in 50 ml THF and then, added dropwise into the maleic anhydride solution at room temperature, precipitation of the product and a exothermic reaction was observed immediately. The reaction mixture was reacted at room temperature for 4 hours and heated to 60° C. for one hour. Thereafter, the product was filtered and washed with THF to remove residual maleic anhydride and then dried in vacuo (ca. 99% in yield ). mp 240°–241° C. Analysis for $C_{30}H_{22}N_2O_8$, Calcd: C, 66.91%; H, 4.09%; N, 5.20%. Found: C, 66.88%; H, 4.13%; N, 5.21%.

(d) Synthesis of 2,7-Bis(4-maleimidophenoxy)naphthalene (BMPN, 34)

In a 250 ml round bottom flask, charged with bismaleamic acid (0.05 mole),acetone (100 ml) and triethylamine (0.03 mole, TEA), and the mixture was stirred at room temperature for 30 minutes. Magnesium chloride (0.1 g) and cobalt acetate (0.01 g )were added, and then, acetic anhydride (0.11 mole) was added dropwise at room temperature over 30 minutes. The reaction mixture was further stirred at room temperature till the product was precipitated in a period of time of about 8–10 hours. The product was filtered and washed with aqueous sodium carbonate till no more odor of acetic acid was detected, followed by washing with deionized water, and dried to obtained an yellow product (ca. 85% in yield). Mp 162°–164° C. Analysis for $C_{30}H_{18}N_2O_6$, Calcd: C, 71.71%; H, 3.59%; N, 5.58%. Found: C, 71.67; H, 3.75%; N, 5.42%. Results of its characterization were set forth in Table 1.

EXAMPLE 2

The bismaleimide monomer of 2,7-bis(2-hydroxyethoxy) naphthalene was synthesized according to the process outlined in the flow sheet shown in FIG. 4. By using 2,7-bis (2-hydroxyethoxy)naphthalene in stead of 2,7-dihydroxynaphthalene, reaction conditions as in Example 1 were employed and steps (a), (b), (c), and (d) were conducted to obtain 2,7-bis (4-maleimidophenoxyethoxy) naphthalene(BMPEN). Results of its characterization were set forth in Table 1.

EXAMPLE 3

The bismaleimide monomer of 1,4-dihydroxybenzene was synthesized according to the process outlined in the flow sheet shown in FIG. 4.

By using 1,4-dihydroxybenzene in stead of 2,7-dihydroxynaphthalene, reaction conditions as in Example 1 were employed and steps (a), (b), (c), and (d) were conducted to obtain 1,4-bis(4-maleimidophenoxy)benzene (BMPB). Results of its characterization were set forth in Table 1.

EXAMPLE 4

The bismaleimide monomer of 1,4-bis(2-hydroxyethoxy) benzene was synthesized according to the process outlined in the flow sheet shown in FIG. 4.

By using 1,4-bis(2-hydroxyethoxy)benzene in stead of 2,7-dihydroxynaphthalene, reaction conditions as in Example 1 were employed and steps (a),(b), (c) and (d) were conducted to obtain 1,4-bid(4-maleimidophenoxyethoxy) benzene (BMPB). Results of its characterization were set forth in Table 1.

EXAMPLE 5

Cyanate ester of 1,4-dihydroxybenzene (PB) was prepared according to the process outlined in the flow sheet shown in FIG. 5.

In a reactor provided with a charging fiunel, a stirrer, and a temperature controlling apparatus, charged with 1,4-dihydroxybenzene (0.05mole), cyanogen bromide (0.12 mole) and acetone (30 mole), and placed the reactor in a ice bath to maintain at −3° to 0° C. Triethylamine (0.11 mole ) was dissolved in 20 ml acetone and the resulting solution was added dropwise into the reactor. An exothermic reaction was resulted while maintained in the ice bath to keep the temperature not higher than 10° C. When the addition of triethylamine was complete, the reaction was continued for one hour. At the end of the reaction, the reaction mixture was poured slowly into a large amount of ice-water, filtered, and the solid thus obtained was washed and dried in vacuo to obtain a product PB (ca. 90% in yield). Characterization results of the product were set forth in Table 2.

EXAMPLE 6

Cyanate ester of biphenol (BB) was prepared according to a process outlined in the flow sheet shown in FIG. 5.

By using biphenol instead of 1,4-dihydroxybenzene, reaction conditions as in Example 5 were employed to obtain its cyanate ester. Characterization results of the product were set forth in Table 2.

EXAMPLE 7

Cyanate ester of 4,4'-dihydroxydiphenylmethane ($CH_2$) was prepared according to a process outlined in the flow sheet shown in FIG. 5.

By using 4,4'-dihydroxydiphenylmethane instead of 1,4-dihydroxybenzene, reaction conditions as in Example 5 were employed to obtain its cyanate ester. Characterization results of the product were set forth in Table 2.

EXAMPLE 8

Cyanate ester of 4,4'-dihydroxyphenylether (E) was prepared according to a process outlined in the flow sheet shown in FIG. 5.

By using 4,4'-dihydroxyphenylether in stead of 1,4-dihydroxybenzene, reaction conditions as in Example 5 were employed to obtain its cyanate ester (E). Characterization results of the product were set forth in Table 2.

EXAMPLE 9

Cyanate ester of bisphenol A (BPA) was prepared according to a process outlined in the flow sheet shown in FIG. 5.

By using bisphenol A instead of 1,4-dihydroxybenzene, reaction conditions as in Example 5 were employed to obtain its cyanate ester (BPA). Characterization results of the product were set forth in Table 2.

EXAMPLE 10

Cyanate ester of 3,3'5,5'-tetramethyldiphenolmethane (4M) was prepared according to a process outlined in the flow sheet shown in FIG. 5.

By using 3,3'5,5'-tetramethyldiphenolmethane instead of 1,4-dihydroxybenzene, reaction conditions as in Example 5 were employed to obtain its cyanate ester (4M). Characterization results of the product were set forth in Table 2.

EXAMPLE 11

Preparation of BT resin from bismaleimide (BMPN) and cyanate ester (PB)

Bismaleimide (BMPN) and cyanate ester (PB) in a proportion of BMI/CE=1/2 were mixed thorougbly and 500 ppm of Cu(acetylacetonate) as catalyst was added in the mixture. After being cured at 180° C. for 2 hours and then at 250° C. for 4 hours, a BT resin designated as BTPB was obtained. The analytical results of its thermal properties were set forth in Table 3, whereas its moisture absorption and dielectric constant were set forth in Table 4.

EXAMPLE 12

Preparation of BT resin from bismaleimide (BMPN) and cyanate ester(BB)

By using cyanate ester(BB) in stead of cyanate ester(PB) as used in Example 11 and employing curing conditions as in Example 11, a BT resin designated as BTBB was obtained. Analytical results of its thermal properties were set forth in Table 3, whereas its moisture absorption and dielectric constant were set forth in Table 4.

EXAMPLE 13

Preparation of BT resin from bismaleimide (BMPN) and cyanate ester (CH2)

By using cyanate ester (CH2) instead of cyanate ester (PB) as used in Example 11 and employing curing conditions as in Example 11, a BT resin designated as BTPB was obtained. Analytical results of its thermal properties were set forth in Table 3, whereas its moisture absorption and dielectric constant were set forth in Table 4.

EXAMPLE 14

Preparation of BT resin from bismaleimide (BMPN) and cyanate ester (E)

By using cyanate ester (E) instead of cyanate ester (PB) as used in Example 11 and employing curing conditions as in Example 11, a BT resin designated as BTE was obtained. Analytical results of its thermal properties were set forth in Table 3, whereas its moisture absorption and dielectric constant were set forth in Table 4.

EXAMPLE 15

Preparation of BT resin from bismaleimide (BMPN) and cyanate ester(BPA)

By using cyanate ester (BPA) instead of cyanate ester (PB) as used in Example 11 and employing curing conditions as in Example 11, a BT resin designated as BTBPA was obtained. Analytical results of its thermal properties were set forth in Table 3, whereas its moisture absorption and dielectric constant were set forth in Table 4.

EXAMPLE 16

Preparation of BT resin from bismaleimide (BMPN) and cyanate ester (4M)

By using cyanate ester (4M) instead of cyanate ester (PB) as used in Example 11 and employing curing conditions as in Example 11, a BT resin designated as BT4M was obtained. Analytical results of its thermal properties were set forth in Table 3, whereas its moisture absorption and dielectric constant were set forth in Table 4.

EXAMPLE 17

Bismaleimide (BMPBN) and cyanate ester (BPA) in various mole ratios of BMPN/BPA =1/0, 4/1, 2/1, 1/1, 1/2, 1/4, and 0/1 were mixed thoroughly, respectively. After adding separately 500 ppm of Cu(acetylacetonate) as catalyst, they were cured at 180 C. for 2 hours, and followed by at 250 C. for 4 hours. BT resins designated as $BT_{1/0}$, $BT_{4/1}$, $BT_{2/1}$, $BT_{1/1}$, $BT_{1/2}$, $BT_{1/4}$, and $BT_{0/1}$ were obtained. Thermal analytical results of these resins were set forth in Table 5.

While objects, feature and effects of the present invention has been described with reference to preferred embodiments thereof, many variations and modifications thereof without departing from the spirit and scope of the invention can be made by those skilled in the art based on the above description. Therefore, the scope of the invention is described only by the appended claim.

TABLE 1

| | | Characterization of bismaleimides | | | | | | | |
|---|---|---|---|---|---|---|---|---|---|
| | | Analysis Found (Calcd)(%) | | | Characteristic absorption in IR spectra (cm$^{-1}$) | | | | NMR Chemical shift[a] |
| bismaleimide | formula | C | H | N | imide ring C=O | C—N—C | C—O—C | maleimide ring C=C | (ppm) |
| BMPN | $C_{30}H_{18}N_2O_6$ | 70.94 (71.71) | 3.88 (3.59) | 5.51 (5.58) | 1780, 1720 | 1390 | 1250 | 690 | 7.15(s, 4H, Olefinic); 7.18–8.00(m, 14H, ar) |
| BMPEN | $C_{34}H_{26}N_2O_8$ | 68.80 (69.15) | 4.75 (4.41) | 4.96 (4.75) | 1775, 1710 | 1395 | 1240 | 680 | 44(s[b], 8H, CH$_2$); 7.0–7.8 (m[c], 18H, CH=CH, and ar[d]) |
| BMPB | $C_{26}H_{16}N_2O_6$ | 68.87 (69.03) | 3.62 (3.54) | 6.22 (6.19) | 1775, 1720 | 1400 | 1245 | 690 | |

TABLE 1-continued

Characterization of bismaleimides

| bismaleimide | formula | Analysis Found (Calcd)(%) | | | Characteristic absorption in IR spectra (cm$^{-1}$) | | | | NMR Chemical shift[a] |
|---|---|---|---|---|---|---|---|---|---|
| | | | | | imide ring | | | maleimide ring | |
| | | C | H | N | C=O | C—N—C | C—O—C | C=C | (ppm) |
| BMPEB | $C_{30}H_{24}N_2O_8$ | 66.59 (66.67) | 4.54 (4.44) | 5.26 (5.19) | 1785, 1710 | 1395 | 1250 | 680 | 4.2–4.3(s, 8H, CH$_2$); 6.9(s, 4H, olefinic); 7.0–7.3(m, 12H, ar) |

[a]Solvent DMSO-d6
[b]Singlet
[c]Multiplet
[d]aromatic ring H

TABLE 2

Characterization of cyanate ester monomers.

| cyanate monomer | Analysis Found (Calcd)(%) | | | NMR Chemical shift | Mass spectrometry (m/e) |
|---|---|---|---|---|---|
| | C | H | N | | |
| PB | 60.21 (60.00) | 2.42 (2.50) | 15.57 (17.50) | 764(s[b], 4H, ar[d]) | 160(M$^+$, 100) |
| BB | 71.34 (71.19) | 3.48 (3.39) | 11.71 (11.86) | 7.52–7.39(m[c], 8H, ar) | 236(M$^+$, 100) |
| CH2 | 72.15 (72.00) | 4.06 (4.00) | 11.14 (11.20) | 4.02(s, 2H, CH$_2$) 7.38(s, 8H, ar) | 250(M$^+$, 98); 208(M$^+$—OCN, 100) |
| E | 66.59 (66.67) | 3.12 (3.17) | 11.02 (11.11) | 7.14–7.51(m, 8Har) | 252(M$^+$, 100) |
| BPA | 73.31 (73.38) | 5.09 (5.04) | 10.15 (10.07) | 1.63(s, 6H, CH$_3$) 7.35(S, 8H, ar) | 278(M$^+$, 22); 263(M$^+$—CH$_3$, 100) |
| 4M | 71.77 (72.00) | 4.21 (4.20) | 11.04 (11.20) | 2.30(s, 12H, CH$_2$); 3.81 (s, 2H, CH$_2$); 7.10(S, 4H, ar) | 306(M$^+$, 100); 291(M$^+$—CH$_3$, 56) 264(M$^+$—OCN, 84) |

[a]solvent DMSO-d6
[b]Singlet
[c]Multiplet
[d]aromatic ring H

TABLE 3

Results of thermal and thermogravimetric analysis of various cyanate ester and bismaleimide mixture at 2/1 molar ratio[c]

| Example | resin | Tg (°C.) | T$_{5\%}$[a] (°C.) | T$_{10\%}$[a] (°C.) | T$_{max}$[b] (°C.) | Char yield at 600° C.(%) |
|---|---|---|---|---|---|---|
| 1 | BT$_{PB}$ | 322 | 439 | 461 | 464 | 70 |
| 2 | BT$_{BB}$ | 305 | 433 | 441 | 458 | 68 |
| 3 | BT$_{CH2}$ | 266 | 431 | 441 | 445 | 64 |
| 4 | BT$_E$ | 255 | 418 | 429 | 432 | 60 |
| 5 | BT$_{BPA}$ | 269 | 425 | 433 | 434 | 62 |
| 6 | BT$_{4M}$ | 250 | 403 | 423 | 435 | 53 |
| comparative example | DGEDN[d] | 176 | 350 | 371 | 403 | 48 |

[a]the temperature at which 5% or 10% of thermogravimetric loss occurs in a nitrogen system at a heating rate of 20° C. per minute.
[b]the temperature at which the maximum thermal decomposition rate occurs.
[c]cured at 180° C. for 2 hours and then at 250° C. for 4 hours.
[d]an dihydroxynaphthalene-based epoxy resin cured with diaminodiphenol-methane (DDM), used as a comparative example.

TABLE 4

Moisture absorption and dielectric constant of BT resins

| Examples | BT resins | moisture absorption(a) (wt %) | dielectric constant(b) |
|---|---|---|---|
| 1 | BT$_{PB}$ | 1.7 | 3.20 |
| 2 | BT$_{BB}$ | 1.4 | 3.28 |
| 3 | BT$_{CH2}$ | 1.2 | 3.07 |
| 4 | BT$_E$ | 1.3 | 3.13 |
| 5 | BT$_{BPA}$ | 1.1 | 3.04 |
| 6 | BT$_{4M}$ | 0.8 | 2.93 |
| comparative example | DGEDN[c] | 3.3 | 3.92 |

(a) Moisture absorption test

Place a cured resin test disc, 1 mm(T)×50 mm(D), in a vacuum oven (110° C., 1 hour) to remove its moisture. Then, cooled in a desiccator and measured their weight (Wo), respetively. After immersing again in 100° C. water for 72 hours, their weights were measured (W), respectively, and moisture absorption rates were calculated based on the following formula:

Weight gain (%) = $\frac{W - W_O}{W_O} \times 100\%$ (b) Measurement of dielectric constant Test samples were placed in a vacuum oven maintained at 100° C. and dried under reduced pressure for 8 hours. The dielectric analyzer was warmed up previously for 30 minutes, purged with nitrogen at a flow rate of 500 ml/min., set under two parallel plate mode, and measured test samples by using two parallel gold-plated plate sensor at a constant temperature of 30° C., a pressure between two parallel plates of 300N, and a scanning frequency of 1 MHz.

(c) a dihydroxynaphthalene-based epoxy resin cured with diaminodiphenylmethane (DDM), used as a comparative example.

TABLE 5

Results of thermogravimetric analysis of cured cyanate ester BPA with bismaleimide mixture at various molar ratio[c]

| | $T_{5\%}$[a] (°C.) | $T_{10\%}$[a] (°C.) | $T_{max}$[b] (°C.) | Char yield at 600° C.(%) |
|---|---|---|---|---|
| $BT_{1/0}$ | 475 | 487 | 491 | 67 |
| $BT_{4/1}$ | 431 | 449 | 434 | 71 |
| $BT_{2/1}$ | 434 | 443 | 434 | 64 |
| $BT_{1/1}$ | 429 | 435 | 440 | 47 |
| $BT_{1/2}$ | 425 | 433 | 434 | 62 |
| $BT_{1/4}$ | 413 | 429 | 437 | 62 |
| $BT_{0/1}$ | 401 | 423 | 428 | 42 |

[a]the temperature at which 5% or 10% of thermogravimetric loss occurs in a nitrogen system at a heating rate of 20° C. per minute.
[b]the temperature at which the maximum thermal decomposition rate occurs.
[c]cured at 180° C. for 2 hours and then at 250° C. for 4 hours.

What is claimed is:

1. A bismaleimide-triazine resin comprising a bismaleimide of formula (I)

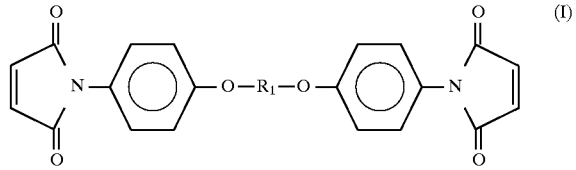

wherein R1 is

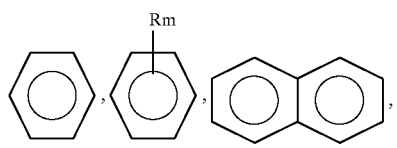

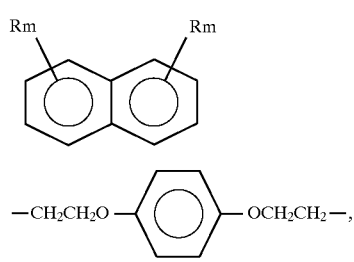

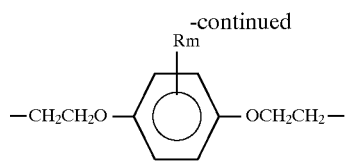

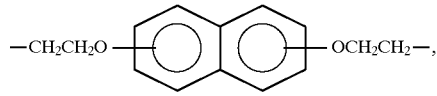

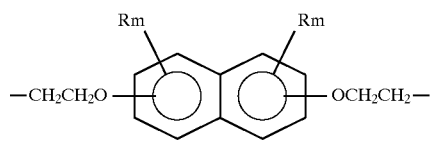

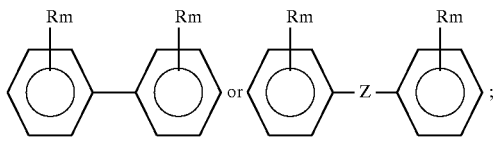

and a cyanate ester of formula (II)

NCO—R2—CCN    (II)

wherein R2 is

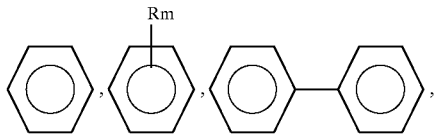

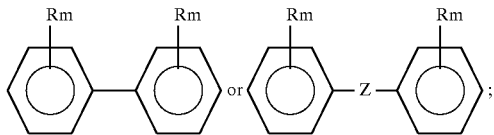

where R is H, (C1–C7) alkyl, (C4–C7) cycloalkyl, or phenyl; m=0–4, Z is

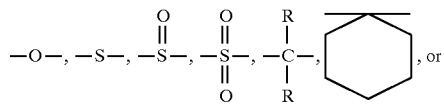

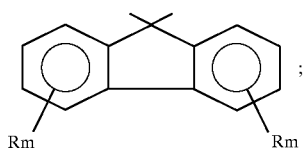

the mole ratio of (I):(II) is in a range of 95/5–5/95.

2. A bismaleimide-triazine resin as claimed in claim 1 wherein R1 in formula (I) is

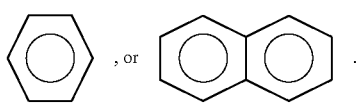

3. A bismaleimide-triazine resin as claimed in claim 1 wherein R2 in formula (II) is

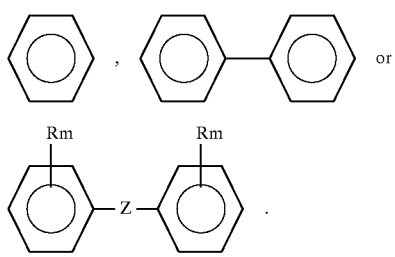

4. A method for preparing a bismaleimide-triazine resin comprising melt copolymerizing in the presence or absence of a catalyst, a bismaleimide of formula (I)

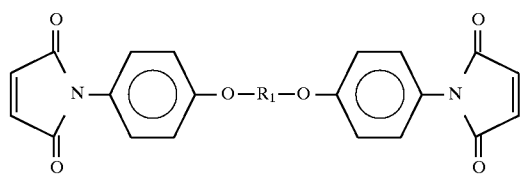

wherein $R_1$ is

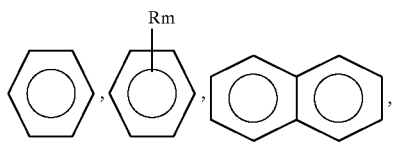

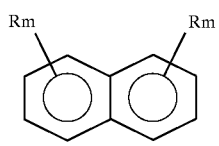

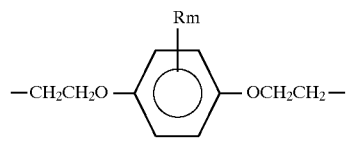

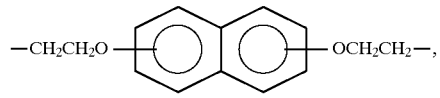

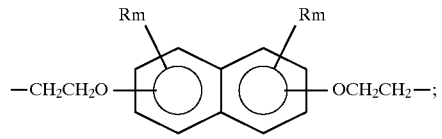

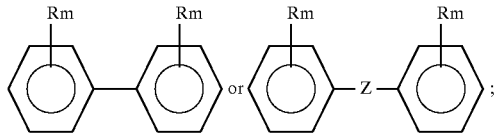

with a cyanate ester of formula (II)

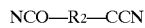

wherein $R_2$ is

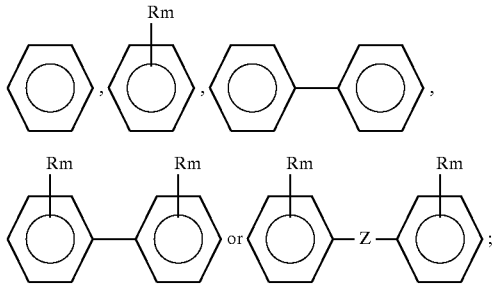

wherein R may be H, ($C_1$–$C_7$) alkyl, ($C_4$–$C_7$) cycloaklyl, or phenyl; m=0–4; and wherein the mole ratio of (I):(II) is in range of 95/5–5/95.

5. A method as in claim 4 wherein $R_1$ in said bismaleimide of formula (I) is

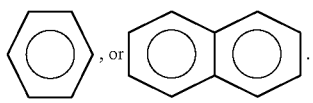

6. A method as in claim 4, wherein $R_2$ in said cyanate of formula (II) is

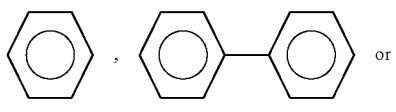

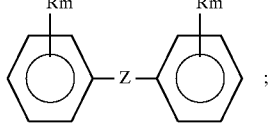

Z is

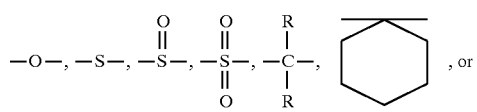

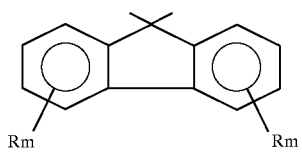

7. A method as in claim 4, wherein the catalyst is Cu(acetylacetonate).

8. A bismaleimide-triazine resin as claimed in claim 1 wherein R is H or $CH_3$ and m is 0 or 1.

9. A bismaleimide-triazine resin as claimed in claim 4 wherein R is H or $CH_3$ and m is 0 or 1.

* * * * *